(12) United States Patent
Wang et al.

(10) Patent No.: US 8,038,749 B2
(45) Date of Patent: Oct. 18, 2011

(54) COMPOSITION FOR REMOVING PHOTORESIST LAYER AND METHOD FOR USING IT

(75) Inventors: Shumin Wang, Shanghai (CN); Chris Chang Yu, Shanghai (CN)

(73) Assignee: Anji Microelectronics (Shanghai) Co., Ltd., Shanghai (CN)

( * ) Notice: Subject to any disclaimer, the term of this patent is extended or adjusted under 35 U.S.C. 154(b) by 448 days.

(21) Appl. No.: 11/920,247

(22) PCT Filed: May 12, 2006

(86) PCT No.: PCT/CN2006/000954
§ 371 (c)(1),
(2), (4) Date: Nov. 13, 2007

(87) PCT Pub. No.: WO2006/119709
PCT Pub. Date: Nov. 16, 2006

(65) Prior Publication Data
US 2009/0100764 A1    Apr. 23, 2009

(30) Foreign Application Priority Data
May 13, 2005  (CN) .......................... 2005 1 0025821

(51) Int. Cl.
*C09G 1/02* (2006.01)
*C09G 1/04* (2006.01)

(52) U.S. Cl. ................ 51/293; 51/298; 51/307
(58) Field of Classification Search .................... 51/293, 51/298, 307
See application file for complete search history.

(56) References Cited

U.S. PATENT DOCUMENTS

| | | | | |
|---|---|---|---|---|
| 4,401,747 | A * | 8/1983 | Ward et al. | 510/176 |
| 5,962,197 | A * | 10/1999 | Chen | 430/331 |
| 6,099,604 | A | 8/2000 | Sandhu et al. | |
| 6,274,537 | B1 | 8/2001 | Park et al. | |
| 6,276,996 | B1 * | 8/2001 | Chopra | 451/41 |
| 6,361,402 | B1 | 3/2002 | Canaperi et al. | |
| 6,579,810 | B2 | 6/2003 | Chang | |
| 6,777,380 | B2 | 8/2004 | Small et al. | |
| 6,803,353 | B2 | 10/2004 | Martyak et al. | |

FOREIGN PATENT DOCUMENTS

| | | |
|---|---|---|
| CN | 1543592 | 11/2004 |
| TW | 227729 | 2/2005 |
| WO | WO 03/007085 | 1/2003 |
| WO | WO 03/104900 | 12/2003 |

OTHER PUBLICATIONS

International Search Report dated Aug. 24, 2006.

* cited by examiner

*Primary Examiner* — Elizabeth Wood
(74) *Attorney, Agent, or Firm* — Jacobson Holman PLLC

(57) ABSTRACT

A composition for removing a photoresist layer and a method for using it are disclosed. The composition comprises a chemical portion which includes water and chemical constituents dissolving or softening the photoresist layer and a mechanical portion which is abrasive particles. Using the composition and the method according to the present invention can decrease the conventional two steps of removing a photoresist layer process to one step, thereby simplifying the procedure, shortening the removing time and reducing the cost. The chemical constituents in the composition according to the present invention are of low toxicity and flammability and the amount used is small, which makes it more friendly with the environment and decreases the expense of disposing the waste.

8 Claims, 1 Drawing Sheet

US 8,038,749 B2

COMPOSITION FOR REMOVING PHOTORESIST LAYER AND METHOD FOR USING IT

This is a national stage of International Application No. PCT/CN2006/000954 filed May 12, 2006.

TECHNICAL FIELD

The present invention relates to a composition for removing photoresist layer in manufacture of semiconductor devices and a method for using it.

TECHNICAL BACKGROUND

In the manufacturing process of semiconductor devices, the coating, light exposing and imaging of photoresist layer are necessary technological steps for the formation of patterns on devices as shown in FIG. 1. The photoresist layer to be ion implanted on the substrate of ground layer must be removed after imaging while the photoresist layer not to be ion implanted on the substrate must be preserved. After ion implantation, the photoresist layer must be removed, and then annealing is performed. Until now a two-step method has been used to remove the photoresist layer. In the first step, plasma etching is employed to remove the most part of the photoresist layer and then a wet etching/washing technique is employed to remove and wash off the remaining photoresist layer. In the plasma etching step, a very strong ashrizing machine must be used. In the second step, a washing solution of strong chemical activity is necessary, which is generally toxic and flammable. In the plasma etching step, a fluorine containing compound is used. In the subsequent wet etching/washing technique, the generally used chemical constituents are an organic solvent and a fluoride in high concentration. The wet etching/washing must take place in a heated environment and the time is long because during doping step after ion bombardment the polymer in photoresist layer becomes stiff and, therefore, its solubility is lowered, thus the wet etching/washing time must be sufficiently long. U.S. Pat. Nos. 6,777,380, 6,274,537, 6,692,903 etc all use a two-step method said above. Moreover, the existing method sometimes cannot guarantee complete removal of photoresist layer.

In a word, this technology is of high cost and low yield and is complicated by problems of environment and remaining photoresist layer. It is, therefore, urgently necessary to propose a new technology for cleaning the photoresist layer.

SUMMARY OF INVENTION

The aim of the present invention is just to solve the above problems by providing a composition for removing photoresist layer. The composition comprises a chemical portion and a mechanical portion and a mechanical portion. The chemical portion contains chemical constituents and water dissolving or/and softening the photoresist layer; the mechanical portion is abrasive particles.

Said chemical portion can also contain a surfactant and/or an inhibitor. The surfactant helps the improvement of washing effect of chemical constituents. The inhibitor can lower or prevent the chemical or mechanical loss, corrosion and pit corrosion of substrate of ground layer. In ion implantation, a typical substrate is silicon substrate, and sometimes there is a thin layer of oxide is deposited on the silicon substrate. The polishing pad used is any planar plastic sheet or a plastic sheet surface treated or surface channeled to assure distribution of enough washing solution on the substrate being polished. The substrate of ground layer include but not limited to silicon, silicon dioxide, ion doped silicon dioxide, materials of low dielectric constant K and metals such as aluminum and copper.

The concentration of abrasive particles is not more than 40%. The concentration of chemical constituents is 1-70%. The concentration of surfactant is 0.001-5%. The concentration of inhibitor is 0.005-10%. The remainder is water. The percentages above refer to mass percentages of a whole composition.

Said abrasive particles are inorganic and or/organic polymer abrasive particles.

The inorganic abrasive particles are preferably one or more of silicon dioxide, aluminum oxide, titanium dioxide, cerium dioxide and zirconium oxide.

The organic polymer abrasive particles are macromolecular polymer abrasive particles insoluble in the composition.

The average particle size of abrasive particles is preferably 0.005-1.0 μm, more preferably 0.02-0.5 μm.

Said chemical constituents are oxidants, organic solvents or inorganic dissolution aids. Oxidants are one or more of organic or inorganic peroxides, preferably hydrogen peroxide, peracetic acid, perboric acid, sodium peroxide, ammonium peroxysulfate, potassium permanganate, nitric acid and/or nitrate. The organic solvents are preferably organic amine, organic alcohol, organic alcohol amine, organic ether and/or organic ketone. The inorganic dissolution aids are water soluble inorganic salts capable of increasing the solubility of photoresist layer, thus aiding in converting or dissolving photoresist layer. The inorganic dissolution aids are preferably KOH, $KNO_3$, $K_3PO_4$, $K_2SO_4$, $NH_4NO_3$, $(NH_4)_2SO_4$, $CsNO_3$, CsOH, KCl, CsCl, $NH_4Cl$ and/or ammonium oxalate and the like.

The water is preferably deionized water.

The chemical portion can also contain one or more of complexing agent, dispersing agent, catalyst and PH adjusting agent.

Another aim of the present invention is to provide methods using the above composition, comprising the following steps:
1) placing a polishing pad on a polishing platform, placing a wafer in a wafer clamp, and applying a suitable pressure to make the wafer contact with the polishing pad;
2) applying a composition of the invention onto the polishing pad and the wafer in contact with the polishing pad, rotating the polishing pad and/or the wafer to rub the polishing pad against the wafer surface until the photoresist layer is thoroughly removed.

The method can also comprise a washing step: taking the polished wafer from the clamp and washing it. It is possible to wash the wafer only using deionized water. Preferably, the deionized water contains additives, achieving a better cleaning effect. In the washing step, the wafer maybe brushed while being washed. Washing of wafer maybe performed on same or different polishing platforms using same or different polishing pads to buffer the wafer surface.

The improved effects of the present invention lie in the following:
1. removing the photoresist layer using the composition of the present invention can allow the photoresist layer cleaning technology to be decreased to a one-step method (chemical mechanical polishing cleaning) from the existing two-step method (plasma etching and wet etching), thus simplifying the technology and lowering the cost.
2. the composition uses chemical substances of low toxicity and flammability and uses low amount of these chemical substances, which makes the composition more friendly toward environment and decreases the expense of disposal of chemical waste (particularly because of the lowered amount of use of the chemical substances).
3. the use of the composition shortens the time of the cleaning technology, and ultimately enhances yield.
4. the composition removes residue more thoroughly and thus enhances electrical conductivity.

DISCLOSURE OF INVENTION

Figure 1:
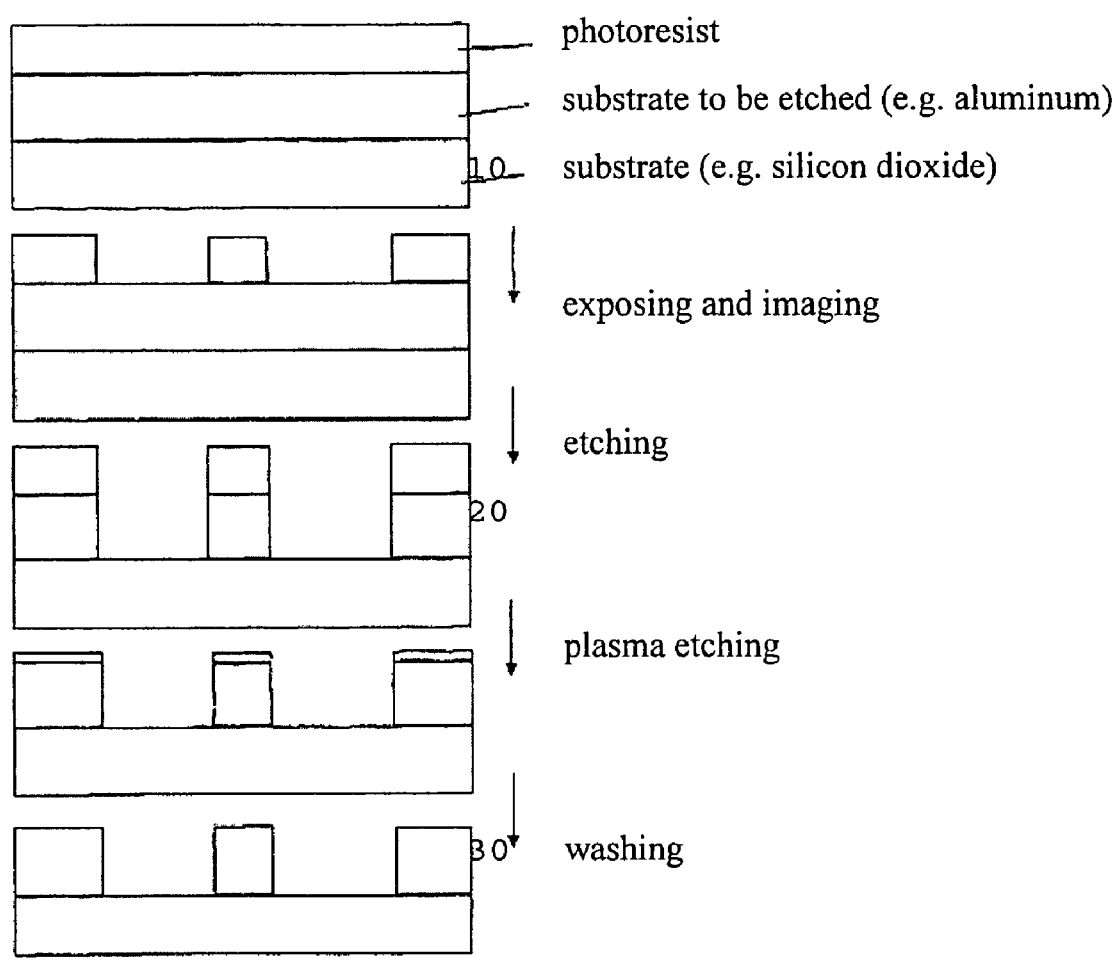
FIG. 1 is a flow chart of the coating, light exposing and imaging, plasma etching of photoresist layer.

In the following some preferred examples of the present invention are given to illustrate in detail the technical embodiment of the present invention.

Example 1

Composition of the composition: 150 g silicon dioxide powder with average particle size of 80 nm, 1500 g ethanolamine and 1350 g deionized water.
Place a polishing pad on a polishing platform; place a wafer in a wafer clamp; apply a pressure of 3 psi to make the wafer contact with the polishing pad; apply the composition said above onto the polishing pad and the wafer in contact with the polishing pad; rotate the polishing pad at 75 rpm and rotate the wafer at 55 rpm to make the polishing pad rub against the wafer surface until the photoresist layer is thoroughly removed.

Example 2

Composition of the composition: 150 g titanium dioxide powder with average particle size of 50 nm, 1500 g ethanolamine and 1350 g deionized water.
Place a polishing pad on a polishing platform; place a wafer in a wafer clamp; apply a pressure of 3 psi to make the wafer contact with the polishing pad; apply the composition said above onto the polishing pad and the wafer in contact with the polishing pad; rotate the polishing pad at 75 rpm and rotate the wafer at 55 rpm to make the polishing pad rub against the wafer surface until the photoresist layer is thoroughly removed.

Example 3

Composition of the composition: 150 g silicon dioxide powder with average particle size of 100 nm, 30 g ammonium peroxysulfate, 1000 g ethanol, 3 g nonionic surfactant and 1817 g deionized water.
Composition of the composition: 150 g titanium dioxide powder with average particle size of 50 nm, 1500 g ethanolamine and 1350 g deionized water.
Place a polishing pad on a polishing platform; place a wafer in a wafer clamp; apply a pressure of 2 psi to make the wafer contact with the polishing pad; apply the composition said above onto the polishing pad and the wafer in contact with the polishing pad; rotate the polishing pad at 75 rpm and rotate the wafer at 55 rpm to make the polishing pad rub against the wafer surface until the photoresist layer is thoroughly removed.

Example 4

Composition of the composition: 1200 g alumina powder with average particle size of 5 nm, 15 g ammonium peroxysulfate, 15 g diaminoethane, 0.03 g nonionic surfactant, 0.15 g benzotriazole and 1769.82 g deionized water.
Composition of the composition: 150 g titanium dioxide powder with average particle size of 50 nm, 1500 g ethanolamine and 1350 g deionized water.
Place a polishing pad on a polishing platform; place a wafer in a wafer clamp; apply a pressure of 1 psi to make the wafer contact with the polishing pad; apply the composition said above onto the polishing pad and the wafer in contact with the polishing pad; rotate the polishing pad at 75 rpm and rotate the wafer at 55 rpm to make the polishing pad rub against the wafer surface until the photoresist layer is thoroughly removed.

Example 5

Composition of the composition: 10 g abrasive particles made of polyaminoformate with average particle size of 1000 nm, 1830 g diaminoethane, 150 g nonionic surfactant, 270 g potassium nitrate, 30 g triazole and 710 g deionized water.
Composition of the composition: 150 g titanium dioxide powder with average particle size of 50 nm, 1500 g ethanolamine and 1350 g deionized water.
Place a polishing pad on a polishing platform; place a wafer in a wafer clamp; apply a pressure of 3 psi to make the wafer contact with the polishing pad; apply the composition said above onto the polishing pad and the wafer in contact with the polishing pad; rotate the polishing pad at 75 rpm and rotate the wafer at 55 rpm to make the polishing pad rub against the wafer surface until the photoresist layer is thoroughly removed.

The invention claimed is:
1. A composition for removing photoresist layer comprising abrasive particles, water, an oxidant, an organic solvent and an inorganic dissolution aid, wherein said inorganic dissolution aid is $KNO_3$, $K_3PO_4$, $K_2SO_4$, $NH_4NO_3$, $(NH_4)_2SO_4$, $CsNO_3$, $KCl$, $CsCl$, or $NH_4Cl$; wherein the organic solvent is organic amine, organic alcohol, organic alcohol amine, ether and/or organic ketone; and wherein the average particle size of the abrasive particles is 0.005-1.0 µm.
2. The composition of claim 1, wherein the abrasive particles are inorganic and/or organic polymer.
3. The composition of claim 2, wherein the inorganic abrasive particles are one or more of silicon dioxide, aluminum oxide, titanium dioxide, cerium dioxide, zirconium oxide; and the organic polymer abrasive particles are macromolecular polymer abrasive insoluble in the composition.
4. The composition of claim 1, wherein the average particle size of the abrasive particles is 0.02-0.5 µm.
5. The composition of claim 1, wherein the oxidant is hydrogen peroxide, peracetic acid, perboric acid, sodium peroxide, ammonium peroxysulfate, potassium permanganate, nitric acid and/or nitrate.
6. The composition of claim 1, wherein the inorganic dissolution aid is a wafer soluble inorganic salt.
7. The composition of claim 1, wherein the water is deionized water.
8. The composition of claim 1, wherein the composition contains a surfactant and an inhibitor; and wherein the concentration of said abrasive particles is not more than 40 wt %, the concentration of said oxidant, organic solvent or inorganic dissolution aid is 1-70 wt %, the concentration of said surfactant is 0.001-5 wt %, the concentration of said inhibitor is 0.005-10 wt %, the remainder being water.

* * * * *